(12) United States Patent
Ganti et al.

(10) Patent No.: US 11,956,921 B1
(45) Date of Patent: *Apr. 9, 2024

(54) SUPPORT STRUCTURE DESIGNS FOR MEMS-BASED ACTIVE COOLING

(71) Applicant: Frore Systems Inc., San Jose, CA (US)

(72) Inventors: Suryaprakash Ganti, Los Altos, CA (US); Vikram Mukundan, San Ramon, CA (US); Ananth Saran Yalamarthy, Stanford, CA (US); Seshagiri Rao Madhavapeddy, La Jolla, CA (US); Prabhu Sathyamurthy, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 17/459,239

(22) Filed: Aug. 27, 2021

Related U.S. Application Data

(60) Provisional application No. 63/071,898, filed on Aug. 28, 2020.

(51) Int. Cl.
| | |
|---|---|
| *H05K 7/20* | (2006.01) |
| *B81B 7/00* | (2006.01) |
| *H01L 41/09* | (2006.01) |
| *H10N 30/20* | (2023.01) |

(52) U.S. Cl.
CPC ....... *H05K 7/20272* (2013.01); *B81B 7/0061* (2013.01); *H10N 30/2042* (2023.02); *B81B 2201/05* (2013.01)

(58) Field of Classification Search
CPC .............. H05K 7/20272; B81B 7/0061; B81B 2201/05; H10N 30/2042
See application file for complete search history.

(56) References Cited

U.S. PATENT DOCUMENTS

| | | | | |
|---|---|---|---|---|
| 8,520,383 | B2* | 8/2013 | Park | F28F 13/02 |
| | | | | 361/679.48 |
| 9,976,547 | B2* | 5/2018 | Tanaka | F04B 35/04 |
| 11,464,140 | B2* | 10/2022 | Yalamarthy | G06F 1/20 |
| 2005/0074662 | A1* | 4/2005 | Cho | G06F 1/20 |
| | | | | 429/444 |
| 2005/0089415 | A1* | 4/2005 | Cho | F04B 45/047 |
| | | | | 417/413.1 |

(Continued)

OTHER PUBLICATIONS

Mo et al., Unimorph PZT Cymbal Design in Energy Harvesting, Proceedings of the ASME 2011 Conference on Smart Materials, Adaptive Structures and Intelligent Systems SMASIS2011, Sep. 18-21, 2011, Scottsdale, Arizona, USA.

*Primary Examiner* — Stephen S Sul
(74) *Attorney, Agent, or Firm* — Van Pelt, Yi & James LLP

(57) ABSTRACT

A cooling system including a support structure and a cooling element is described. The cooling element has a central region and a perimeter. The cooling element is supported by the support structure at the central region. At least a portion of the perimeter is unpinned. The cooling element is configured to undergo vibrational motion when actuated to drive a fluid toward a heat-generating structure. Further, the cooling element has a first side distal from the heat-generating structure and a second side proximate to the heat-generating structure. The support structure supports the cooling element from one of the first side and the second side.

19 Claims, 9 Drawing Sheets

(56) References Cited

U.S. PATENT DOCUMENTS

| | | | | |
|---|---|---|---|---|
| 2008/0304979 | A1* | 12/2008 | Lucas | F04B 45/04 |
| | | | | 417/327 |
| 2009/0050294 | A1* | 2/2009 | Fedorov | H01L 23/4735 |
| | | | | 165/80.3 |
| 2009/0167109 | A1* | 7/2009 | Tomita | H04N 23/52 |
| | | | | 310/317 |
| 2011/0259557 | A1* | 10/2011 | Chao | F04B 43/046 |
| | | | | 417/413.1 |
| 2012/0269225 | A1* | 10/2012 | Picciotto | F27D 99/0006 |
| | | | | 373/88 |
| 2019/0101938 | A1* | 4/2019 | Mou | G05D 7/0694 |
| 2021/0010467 | A1* | 1/2021 | Fujisaki | F04B 45/047 |

* cited by examiner

US 11,956,921 B1

SUPPORT STRUCTURE DESIGNS FOR MEMS-BASED ACTIVE COOLING

CROSS REFERENCE TO OTHER APPLICATIONS

This application claims priority to U.S. Provisional Patent Application No. 63/071,898 entitled SUPPORT STRUCTURE DESIGNS FOR MEMS-BASED ACTIVE COOLING filed Aug. 28, 2020 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
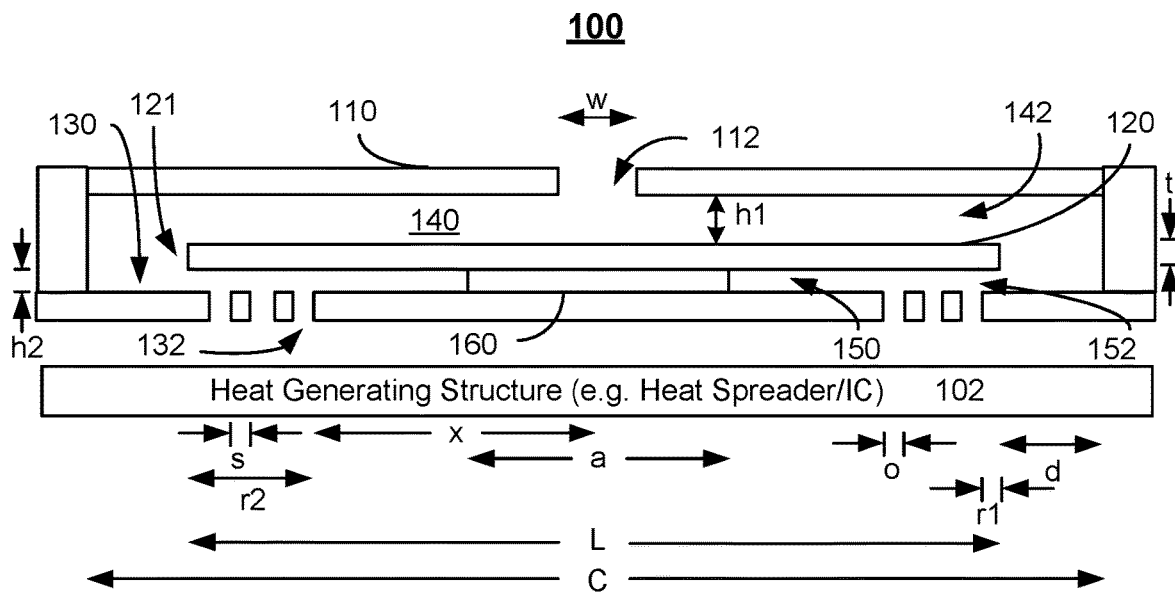
FIGS. 1A-1E depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile devices as well as larger devices are desired.

Although described in the context of a cooling system, the techniques and/or devices described herein may be used in other applications.

A cooling system is described. The cooling system includes a support structure and a cooling element. The cooling element has a central region and a perimeter. The cooling element is also supported by the support structure at the central region. Thus, at least a portion of the perimeter of the cooling element is unpinned. The cooling element is configured to undergo vibrational motion when actuated to drive a fluid toward a heat-generating structure. The cooling element also has a first side distal from the heat-generating structure and a second side proximate to the heat-generating structure. The support structure supports the cooling element from one of the first side and the second side. Although described in the context of the support structure anchoring the cooling element at the central region, in some embodiments, the cooling element may be supported at one edge, with at least one a portion of an opposing edge being free to vibrate. Similarly, although described in the context of a single, continuous cooling element, in some embodiments, the cooling element may be formed by two (or more) cooling elements. Each of the cooling elements as one portion pinned (e.g. supported by the support structure) and an opposite portion unpinned. Thus, a single, centrally supported cooling element may be formed by a combination of multiple cooling elements supported at an edge.

In some embodiments, the support structure supports (e.g. anchors) the cooling element from cooling element's first side distal from the heat-generating structure. In some embodiments, the support structure anchors the cooling element from the cooling element's second side proximate to the heat-generating structure.

In some embodiments, the support structure is configured to induce the vibrational motion in the cooling element. For example, the support structure may translate a central portion of the cooling element, which induces the vibrational motion in the cooling element. For example, the support structure may include a piezoelectric element configured to translate a central portion of the cooling element. In some embodiments, the support structure is configured to bend the central portion of the cooling element, which induces the vibrational motion. For example, in some embodiments, the support structure includes at least one piezoelectric element configured to bend a central portion of the cooling element, thereby inducing the vibrational motion in the cooling element. The cooling element may include a piezoelectric element distal from the central region. In such embodiments, the piezoelectric element induces the vibrational motion of the cooling element.

In some embodiments, the cooling system also includes a cymbal endcap coupled with the cooling element and/or support structure. Thus, the cymbal endcap includes edge regions coupled to the support structure and a center portion distal from the support structure. The edge regions may also include piezoelectric element(s) that may be configured to bend or translate the cooling element. In some embodiments, some or all of the techniques described herein may be combined to cause the cooling element to vibrate.

In some embodiments, the cooling system also includes an orifice plate. The orifice plate includes one or more orifice(s) therein. The orifice plate is disposed between the cooling element and the heat-generating structure. The cooling element is actuated to drive the fluid through the at least one orifice.

In some embodiments, the cooling system is configured to have multiple cooling cells and orifice plate(s). Each of the cooling cells includes a support structure and a cooling element having a central region and a perimeter. The cooling element is supported by the support structure at the central region. At least a portion of the perimeter is unpinned. The cooling element is configured to undergo vibrational motion when actuated to drive a fluid toward a heat-generating structure. The cooling element has a first side distal from the heat-generating structure and a second side proximate to the heat-generating structure. The support structure supports the cooling element from one of the first side and the second side. Thus, the cooling system may have multiple cooling cells, each of which may be analogous to the cooling systems described above. The orifice plate has multiple orifices therein and is disposed between the cooling elements and the heat-generating structure. A portion of the orifices corresponds to each of the cooling cells. Thus, the orifice plate(s) may be shared between multiple cooling cells. Each of the cooling cells may include support structure(s), cooling element(s), cymbal endcap(s) and other features described herein. In some embodiments, the cooling element is driven at a frequency to induce the vibrational motion. In some embodiments, the frequency is in proximity to at least one of a structural resonant frequency for the cooling element and a fluidic resonant frequency. Further, the frequency may be ultrasonic in some embodiment. In some embodiments, feedback from a piezoelectric element used in driving the cooling elements is used to control the frequency at which the cooling element is driven.

FIGS. 1A-1E are diagrams depicting an exemplary embodiment of active cooling system 100 usable with heat-generating structure 102 and including a centrally anchored cooling element 120. For clarity, only certain components are shown. FIGS. 1A-1E are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, the total height does not exceed two hundred and fifty micrometers. In some embodiments, this total height is not more than 1.1 millimeters. In some embodiments, the total height does not exceed one millimeter. Similarly, the distance between the bottom of orifice plate 130 and the top of heat-generating structure 102, y, may be small. In some embodiments, y is at least two hundred micrometers and not more than 1.2 millimeter. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, $\nu$, is at or near the structural resonant frequency for cooling element 120. The frequency $\nu$ is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1B:
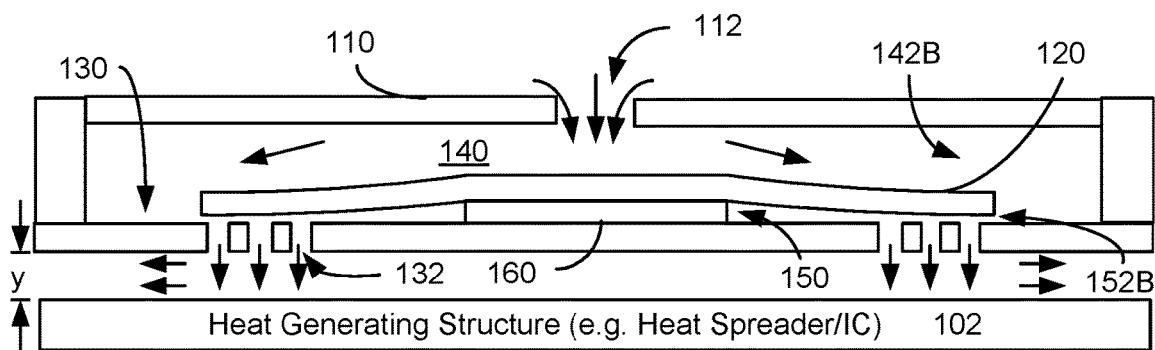
Figure 1C:
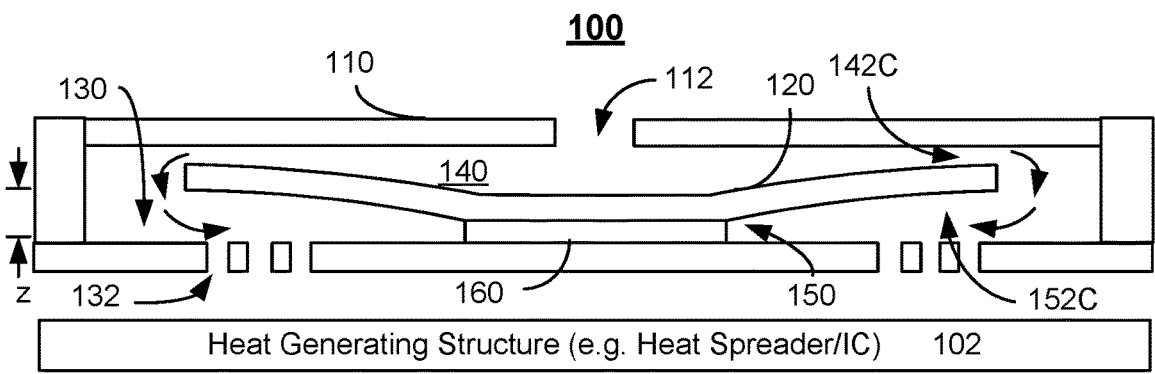

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Figure 1D:
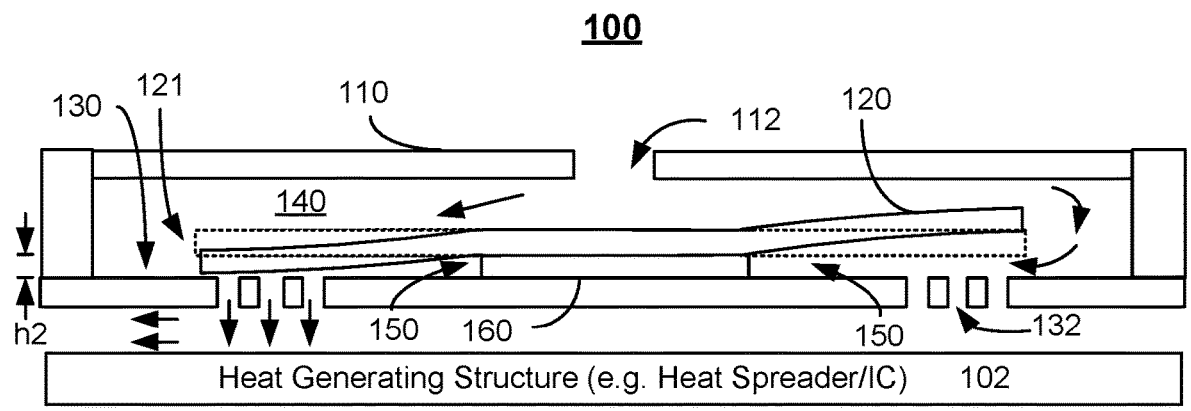
Figure 1E:
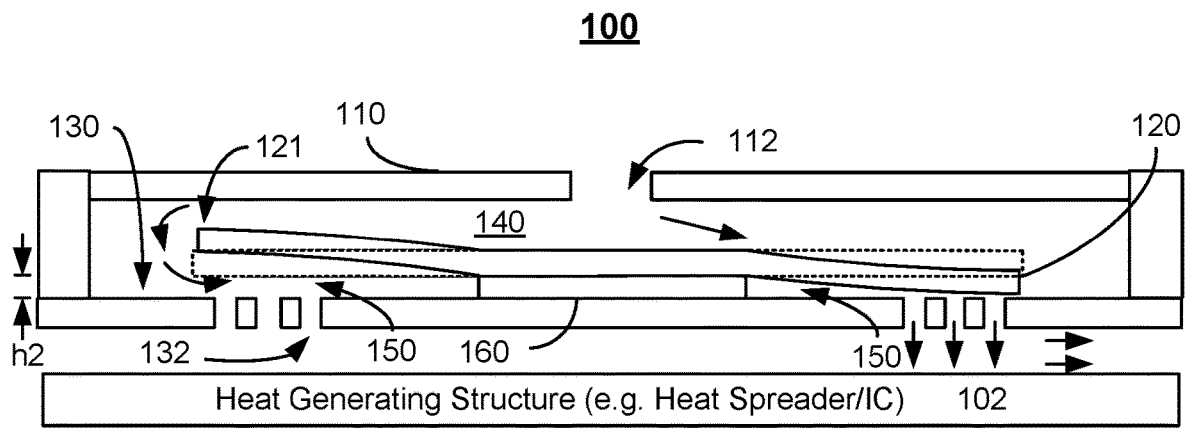

FIGS. 1D-1E depict an embodiment of active cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top cavity 140 to bottom cavity 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These issues are avoided through the use of pressure differentials and fluid flow as discussed above. The benefits of improved, quiet cooling may be achieved with limited additional power. Further, out-of-phase vibration of cooling element 120 allows the position of the center of mass of cooling element 100 to remain more stable. Although a torque is exerted on cooling element 120, the force due to the motion of the center of mass is reduced or eliminated. As a result, vibrations due to the motion of cooling element 120 may be reduced. Moreover, efficiency of cooling system 100 may be improved through the use of out-of-phase vibrational motion for the two sides of cooling element 120. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
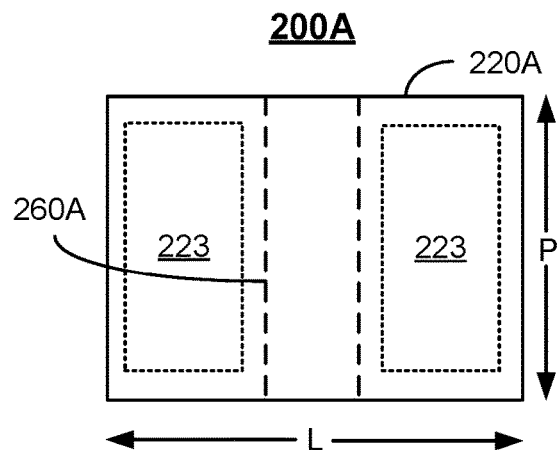
FIGS. 2A-2B depict embodiments of cooling elements usable in active cooling systems including centrally anchored cooling elements.
Figure 2B:
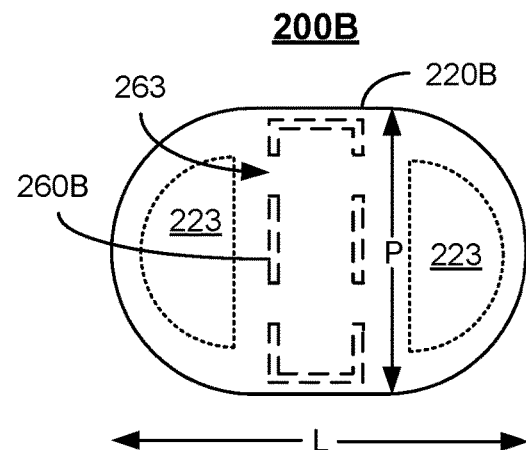

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120. Thus, the sizes and/or materials used for cooling elements 220A and/or 220B may be analogous to those for cooling element 120. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 260A is pinned. The unpinned portions of the perimeter of cooling element 260A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
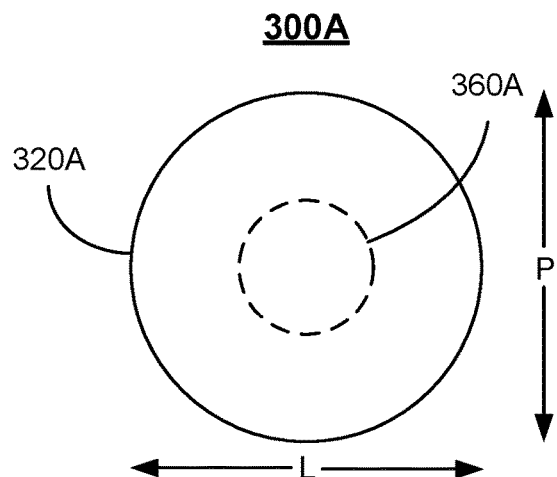
FIGS. 3A-3B depict embodiments of cooling elements usable in active cooling systems including centrally anchored cooling elements.
Figure 3B:
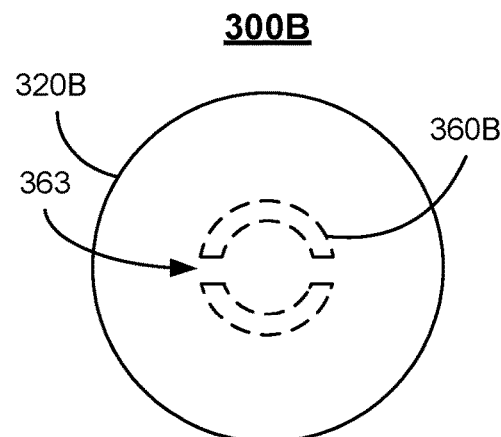

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120. Thus, the sizes and/or materials used for cooling elements 320A and/or 320B may be analogous to those for cooling element 120. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

Figure 4A:
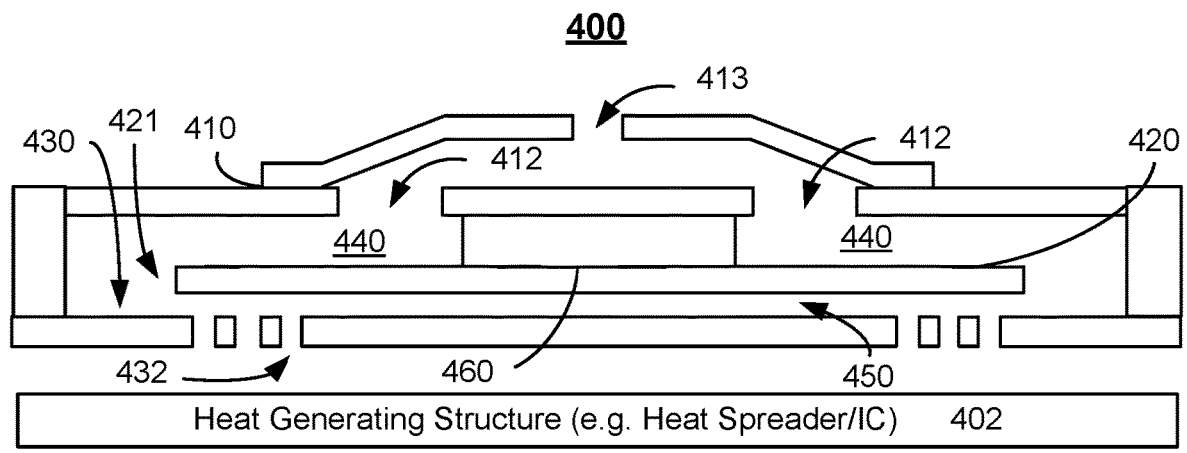
FIGS. 4A-4E depict embodiments of active cooling systems including a top centrally anchored cooling element.
Figure 4B:
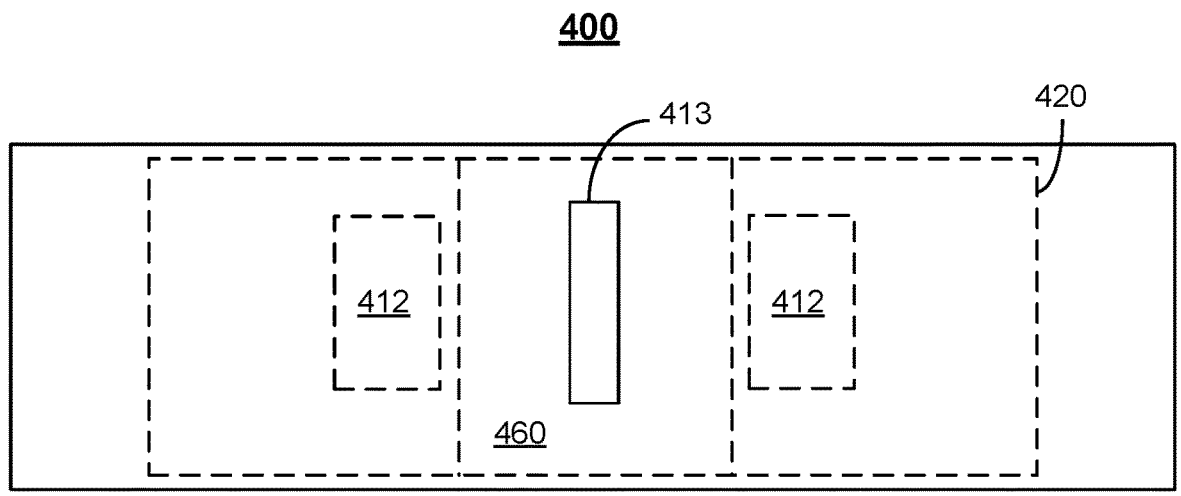
Figure 4C:
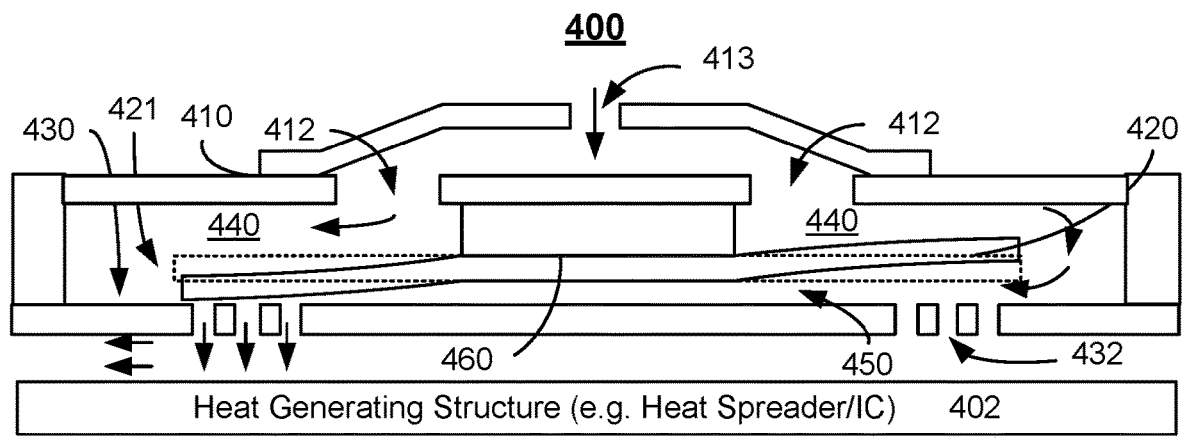
Figure 4D:
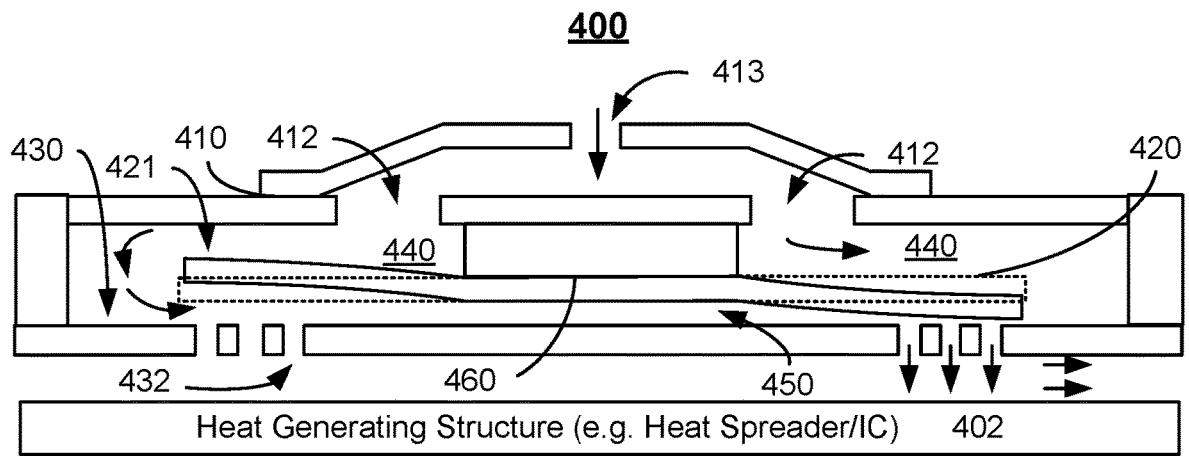
Figure 4E:
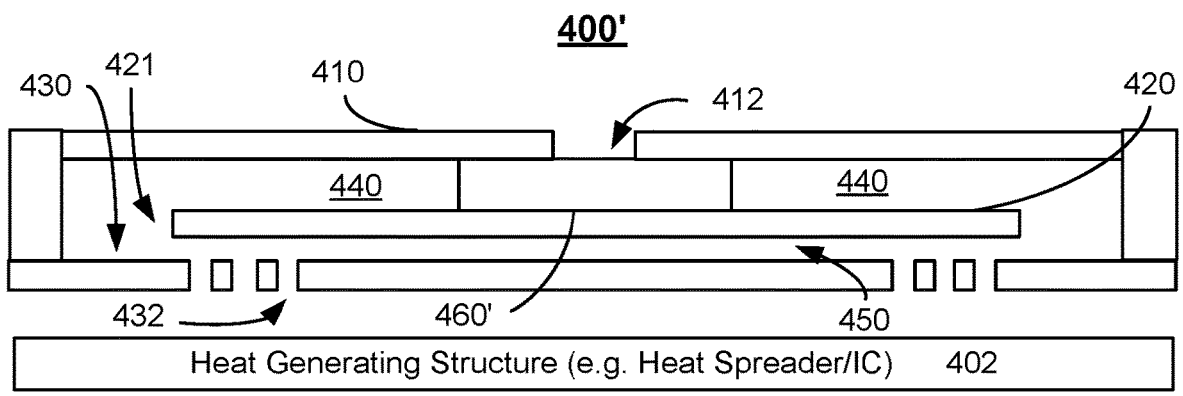

FIGS. 4A-4E depict embodiments of active cooling systems 400 and 400' including a top centrally anchored cooling element. FIGS. 4A-4D depict cooling system 400, while FIG. 4D depicts cooling system 400'. FIG. 4A depicts a side view of cooling system 400 in a neutral position. FIG. 4B depicts a top view of cooling system 400. FIGS. 4C-4D depict side views of cooling system 400 during operation. FIG. 4E depicts a side view of cooling system 400' in a neutral position. FIGS. 4A-4E are not to scale. For simplicity, only portions of cooling systems 400 and 400' are shown. Referring to FIGS. 4A-4D, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420, orifice plate 430 including orifices 432, top chamber 440 having a gap, bottom chamber 450 having a gap and anchor (i.e. support structure) 460 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 220A (e.g. in a manner analogous to anchor 260A and/or 260B). In other embodiments, anchor 460 is only near the center portion of cooling element 420 (e.g. analogous to anchor 360A and/or 360B).

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

FIGS. 4C-4D depict cooling system 400 when cooling element 420 is driven out-of-phase. In some embodiments, cooling element 420 may be driven in-phase. Thus, sections of cooling element 420 on opposite sides of anchor 460 (and thus on opposite sides of the central region of cooling element 420 that is suspended from anchor 460) are driven to vibrate out-of-phase. In some embodiments, sections of cooling element 420 on opposite sides of anchor 460 are driven at or near one hundred and eighty degrees out-ofphase. Thus, one section of cooling element 420 vibrates toward top plate 410, while the other section of cooling element 420 vibrates toward orifice plate 430/heat-generating structure 402. Movement of a section of cooling element 420 toward top plate 410 (an upstroke) drives fluid in top cavity 440 to bottom cavity 450 on that side of anchor 460. Movement of a section of cooling element 420 toward orifice plate 430 drives fluid through orifices 432 and toward heat-generating structure 402. Fluid is also drawn into top chamber 440 through vents 412 and 413. Thus, fluid traveling at high speeds (e.g. speeds described with respect to in-phase operation) is alternately driven out of orifices 432 on opposing sides of anchor 460. The movement of fluid is shown by unlabeled arrows in FIGS. 4C and 4D. This motion is repeated as cooling element 420 undergoes vibrational motion. Although cooling system 400 is described in the context of out-of-phase vibrational motion of portions of cooling element 420, in some embodiments, cooling element 420 may be driven in phase. Thus, cooling system 400 operates in an analogous manner to cooling system 100.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/450. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

FIG. 4E depicts cooling system 400', which is analogous to cooling systems 400 and 100. Consequently, analogous components have similar labels. For example, cooling systems 400' is used in conjunction with heat-generating structure 402. Cooling system 40' includes top plate 410' having vent 412, cooling element 420, orifice plate 430 including orifices 432, top chamber 440 having a gap, bottom chamber 450 having a gap and anchor (i.e. support structure) 460' that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 420 is centrally supported by anchor 460' such that at least a portion of the perimeter of cooling element 420 is free to vibrate. In some embodiments, anchor 460' extends along the axis of cooling element 220A (e.g. in a manner analogous to anchor 260A and/or 260B). In other embodiments, anchor 460 is only near the center portion of cooling element 420 (e.g. analogous to anchor 360A and/or 360B).

Anchor 460' supports cooling element 420 from above. Thus, cooling element 420 is suspended from anchor 460'. Anchor 460' is suspended from top plate 410. Although shown as coinciding with vent 412, anchor 460' may include apertures to allow fluid to flow from vent 412 into top chamber 440. For example, apertures such as apertures 263 and/or 363 may be present in anchor 460. Moreover, anchor 460' may be hollow. Cooling system 400' operates in an analogous manner to cooling systems 100 and 400.

Cooling system(s) 400 and/or 400' share the benefits of cooling system 100. Thus, performance of a device employing cooling system(s) 400 and/or 400' may be improved. In addition, suspending cooling element 420 from anchor(s) 460 and/or 460' may further enhance performance. In particular, vibrations in cooling system(s) 400 and/or 400' that may affect other cooling cells (not shown), may be reduced. For example, less vibration may be induced in top plate 410 due to the motion of cooling element 420. Consequently, cross talk between cooling system(s) 400 and/or 400' and other cooling systems (e.g. other cells) or other portions of the device incorporating cooling system(s) 400 and/or 400' may be reduced. Thus, performance may be enhanced.

As discussed with respect to cooling systems 100, 400 and 400', cooling elements 120 and 420, respectively, are driven to undergo vibrational motion. In some embodiments, the cooling elements 120 and/or 420 may themselves be driven. For example, cooling elements 120 and/or 420 may include piezoelectric layer(s), such as piezoelectric layers 223 of cooling elements 220A and 220B. In some embodiments, however, cooling elements may be driven using the support structure in addition to or in lieu of driving the cooling elements themselves. FIGS. 5-8G depict various embodiments of cooling systems in which the support structures, or anchor, may be used to drive the vibrational motion of the cooling elements. The techniques described in the context of FIGS. 5-8G may be incorporated into other cooling systems such as cooling systems 100 and/or 400. The cooling elements depicted in FIGS. 5-8G may be driven out-of-phase in some embodiments. The cooling elements of FIGS. 5-8G may be driven in-phase in some embodiments.

Figure 5:
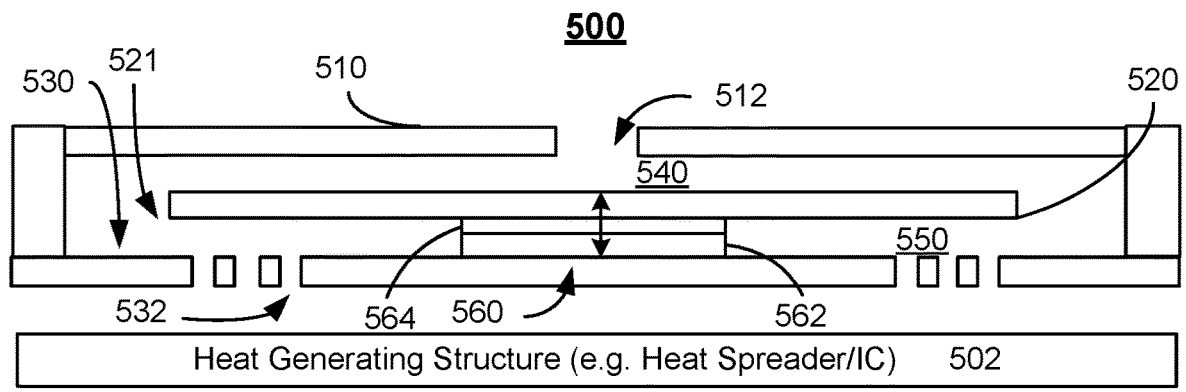
FIG. 5 depicts an embodiment of an active cooling system including a bottom centrally anchored cooling element driven utilizing translation of the bottom anchor.

FIG. 5 depicts an embodiment of active cooling system 500 including a bottom, centrally anchored cooling element driven utilizing translation of the bottom anchor. FIG. 5 is not to scale. For simplicity, only portions of cooling system 500 are shown. Cooling system 500 is analogous to cooling system 100. Consequently, analogous components have similar labels. Cooling system 500 is used in conjunction with heat-generating structure 502, which is analogous to heat-generating structure 102. Cooling system 500 includes top plate 510 having vent 512, cooling element 520, orifice plate 530 including orifices 532, top chamber 540 having a gap, bottom chamber 550 having a gap and anchor (i.e. support structure) 560 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 520 is centrally supported by anchor 560 at its bottom such that at least a portion of the perimeter of cooling element 520 is free to vibrate. In some embodiments, anchor 560 extends along the axis of cooling element 520 (e.g. in a manner analogous to anchor 260A and/or 260B). In other embodiments, anchor 560 is only near the center portion of cooling element 520 (e.g. analogous to anchor 360A and/or 360B).

Anchor 560 includes base 562 and piezoelectric layer 564 configured to induce motion in anchor 560. Although described in the context of a piezoelectric, in some embodiments another material can be used. For example, another material that causes anchor 560 to undergo motion (e.g. in response to an electrical signal) may be used. In the embodiment shown in FIG. 5, piezoelectric layer 564 is configured to induce translational motion in anchor 560 in response to electrical(s) signal provided to piezoelectric layer 564. This motion is indicated by the unlabeled, two-headed arrow of FIG. 5. Because at least a portion of anchor 560 undergoes this translational motion, the central portion of cooling element 520 also undergoes translational motion. As a result, vibrational motion is induced in cooling element 520. For example, tips 521 of cooling element 520 vibrate. This motion is analogous to the motion induced in a cantilever beam when one end of the cantilever beam is translated up and down and the opposing end is free to vibrate.

Cooling system 500 functions in an analogous manner to cooling system 100. Consequently, the benefits described with respect to cooling system 100 may be achieved by cooling system 500. In addition, performance may be further improved. Excitation of anchor 560 may be simply achieved via piezoelectric layer 564. Cooling element 520 may not have a piezoelectric or analogous layer. For example, cooling element 520 may simply be a thin stainless steel, Hastelloy or analogous materials. Consequently, fabrication of cooling element 520 may be simplified. Moreover, a piezoelectric or other layer on cooling element 520 need not undergo vibration. As a result, vibration of cooling element 520 may consume less energy. Thus, efficiency of cooling system 500 may be improved.

Figure 6:
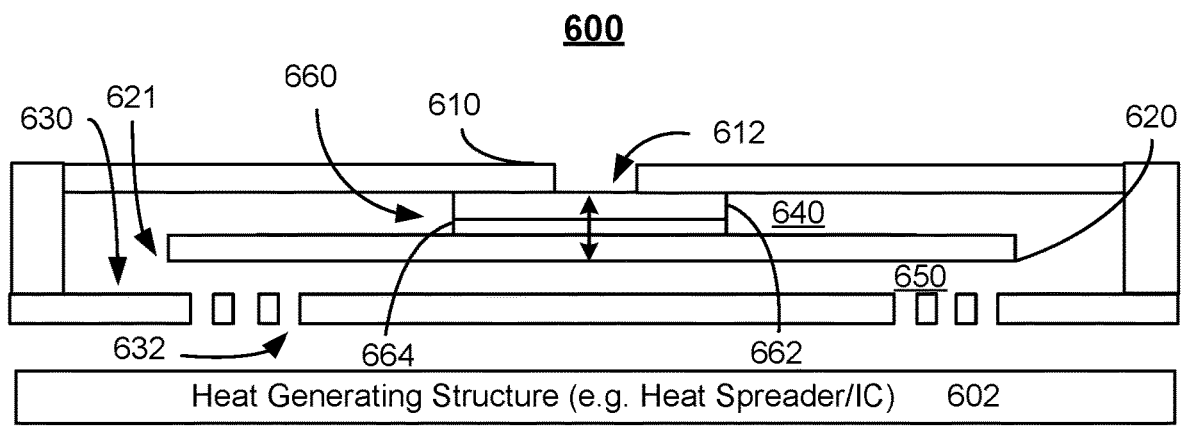
FIG. 6 depicts an embodiment of an active cooling system including a top centrally anchored cooling element driven utilizing translation of the anchor.

FIG. 6 depicts an embodiment of active cooling system 600 including a top, centrally anchored cooling element driven utilizing translation of the bottom anchor. FIG. 6 is not to scale. For simplicity, only portions of cooling system 600 are shown. Cooling system 600 is analogous to cooling system 400. Consequently, analogous components have similar labels. For example, cooling system 600 is used in conjunction with heat-generating structure 602, which is analogous to heat-generating structure 402. Cooling system 600 includes top plate 610 having vent 612, cooling element 620, orifice plate 630 including orifices 632, top chamber 640 having a gap, bottom chamber 650 having a gap and anchor (i.e. support structure) 660 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Thus, cooling element 620 is centrally supported by anchor 660 at its top such that at least a portion of the perimeter of cooling element 620 is free to vibrate. In some embodiments, anchor 660 extends along the axis of cooling element 620 (e.g. in a manner analogous to anchor 260A and/or 260B). In other embodiments, anchor 660 is only near the center portion of cooling element 520 (e.g. analogous to anchor 360A and/or 360B).

Anchor 660 includes base 662 and piezoelectric layer 664 configured to induce motion in anchor 660. Thus, anchor 660 is analogous to anchor 560. However, anchor 660 suspends cooling element 620 from its top (distal from heat-generating structure 602) instead of from its bottom (proximate to heat-generating structure 602). Although described in the context of a piezoelectric, in some embodiments another material can be used. For example, another material that causes anchor 660 to undergo motion (e.g. in response to an electrical signal) may be used. In the embodiment shown in FIG. 6, piezoelectric layer 664 is configured to induce translational motion in anchor 660. This motion is indicated by the unlabeled, two-headed arrow of FIG. 6. This motion is analogous to the motion induced in a cantilever beam when one end of the cantilever beam is translated up and down and the opposing end is free to vibrate.

Cooling system 600 functions in an analogous manner to cooling systems 400 and 500. Consequently, the benefits described with respect to cooling systems 400 and 500 may be achieved by cooling system 600. In addition, performance may be further improved over that of cooling system 100. Excitation of anchor 660 may be simply achieved via piezoelectric layer 664. Cooling element 620 may not have a piezoelectric or analogous layer. For example, cooling element 620 may simply be a thin stainless steel, Hastelloy or analogous materials. Consequently, fabrication of cooling element 620 may be simplified. Moreover, a piezoelectric or other layer on cooling element 620 need not undergo vibration. As a result, vibration of cooling element 620 may consume less energy. Thus, efficiency of cooling system 600 may be improved. Further, anchor 660 and cooling element 620 are suspended from above. In some embodiments, this results in less cross-talk with other cooling cells. Consequently, vibration isolation for cooling system 600 may be improved. Hence, performance of a device incorporating cooling system 600 may be improved.

Figure 7:
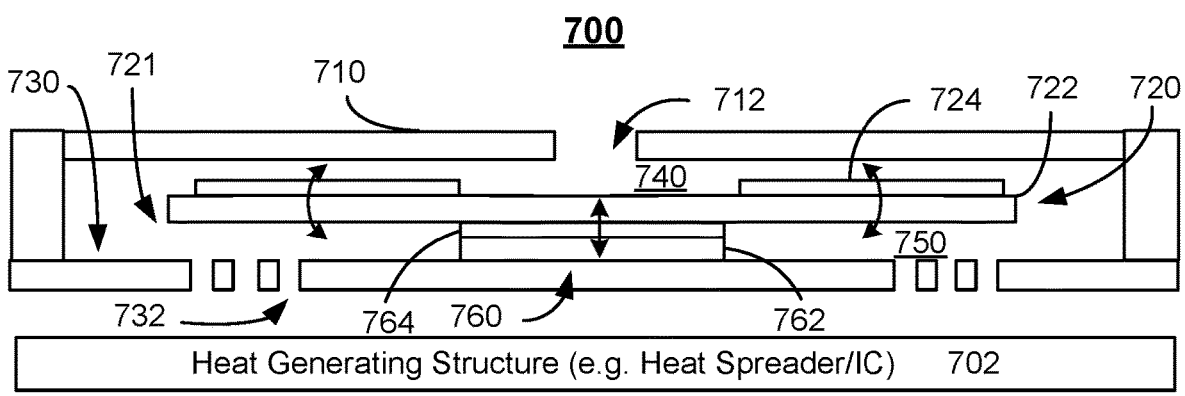
FIG. 7 depicts an embodiment of an active cooling system including a bottom centrally anchored cooling element driven utilizing translation of the anchor.

FIG. 7 depicts an embodiment of active cooling system 700 including a bottom, centrally anchored cooling element driven utilizing translation of the bottom anchor. FIG. 7 is not to scale. For simplicity, only portions of cooling system 700 are shown. Cooling system 700 is analogous to cooling system(s) 500 and/or 600. Consequently, analogous components have similar labels. Although shown in the context of a bottom anchor 760, cooling system 700 may utilized a top anchor analogous to cooling system 600. Cooling system 700 is shown as used in conjunction with heat-generating structure 702, which is analogous to heat-generating structure(s) 102, 502 and/or 602. Cooling system 700 includes top plate 710 having vent 712, cooling element 720, orifice plate 730 including orifices 732, top chamber 740 having a gap, bottom chamber 750 having a gap and anchor (i.e. support structure) 760 that are analogous to top plate 510 having vent 512, cooling element 520, orifice plate 530 including orifices 532, top chamber 540 having gap 542, bottom chamber 550 having gap 552 and anchor (i.e. support structure) 560, respectively. Thus, cooling element 720 is centrally supported by anchor 760 at its bottom such that at least a portion of the perimeter of cooling element 720 is free to vibrate. In some embodiments, anchor 760 extends along the axis of cooling element 720 (e.g. in a manner analogous to anchor 260A and/or 260B). In other embodiments, anchor 760 is only near the center portion of cooling element 720 (e.g. analogous to anchor 360A and/or 360B).

Anchor 760 includes base 762 and piezoelectric layer 764 configured to induce motion in anchor 760. Thus, anchor 760 is analogous to anchor 560. In addition, cooling element 720 includes piezoelectric layer 724. Although shown as residing on the top of cooling element 720, piezoelectric layer 724 may be embedded in or on the bottom of cooling element 720. Further, multiple piezoelectric layers might be used in cooling element 720. Thus, both anchor 760 and cooling element 720 can be driven. Anchor 760 is translated, which induces vibrational motion in cooling element 720. In addition, cooling element 720 is driven to vibrate by driving piezoelectric layers 724. In some embodiments, anchor 760 may be top mounted and used to suspend cooling element 720 in a manner analogous to that shown in cooling system 600.

Cooling system 700 functions in an analogous manner to cooling systems 500 and 600. Consequently, the benefits described with respect to cooling systems 500 and 600 may be achieved by cooling system 700. In addition, cooling element 720 may be separately driven to vibrate. Hence, performance of a device incorporating cooling system 700 may be improved.

Figure 8A:
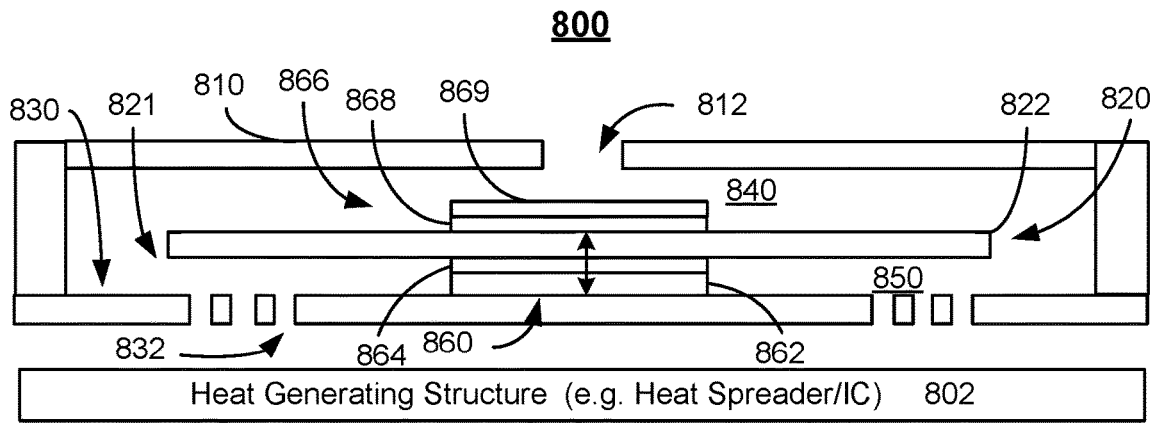
FIGS. 8A-8G depict embodiments of active cooling systems including a centrally anchored cooling element and a cymbal endcap.

FIGS. 8A-8G depict embodiments of active cooling systems 800, 800' and 800" including a centrally anchored cooling element and a cymbal endcap. FIGS. 8A-8G are not to scale. FIG. 8A depicts an embodiment of active cooling system 800. For simplicity, only portions of cooling system 800 are shown. Cooling system 800 is analogous to cooling systems 100 and 500. Consequently, analogous components have similar labels. Cooling system 800 includes top plate 810 having vent 812, cooling element 820, orifice plate 830 including orifices 832, top chamber 840 having a gap, bottom chamber 850 having a gap and anchor (i.e. support structure) 860 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Cooling system 800 is used in connection with heat-generating structure 802, which is analogous to heat-generating structure 102. Thus, cooling element 820 is centrally supported by anchor 860 at its bottom such that at least a portion of the perimeter of cooling element 820 is free to vibrate. In some embodiments, anchor 860 extends along the axis of cooling element 820 (e.g. in a manner analogous to anchor 260A and/or 260B). In other embodiments, anchor 860 is only near the center portion of cooling element 820 (e.g. analogous to anchor 360A and/or 360B).

Figure 8B:
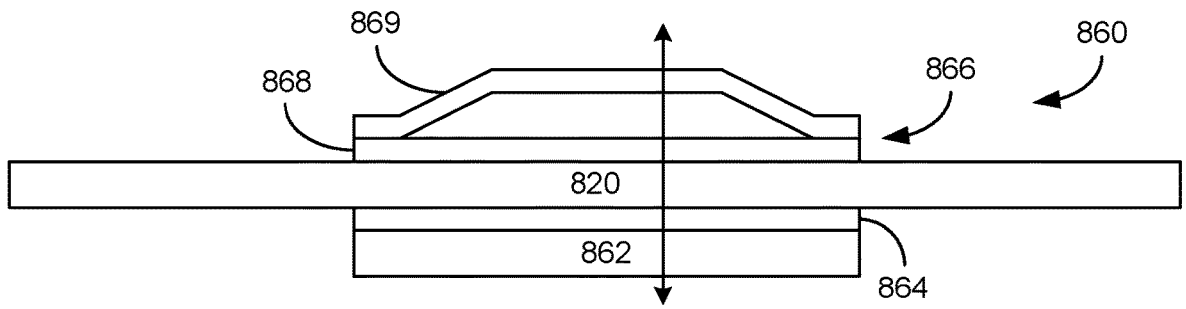
Figure 8C:
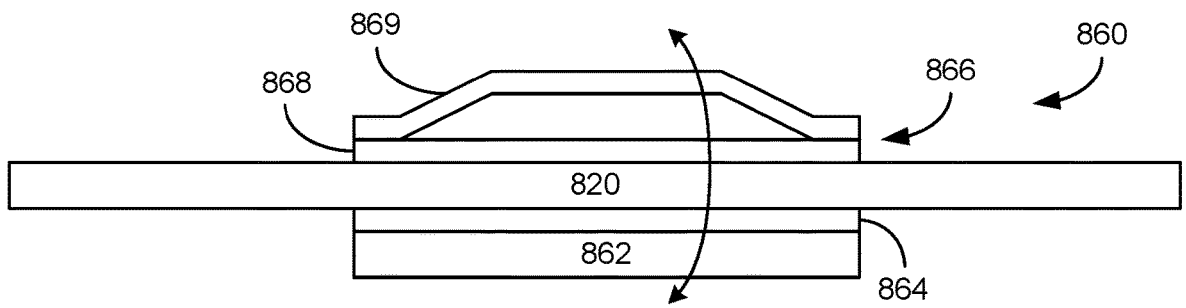

FIGS. 8B and 8C depict views of anchor 860 as well as cooling element 820 perpendicular to that shown in FIG. 8A. Referring to FIGS. 8A-8C, anchor 860 is includes base 862, piezoelectric layer 864 and cymbal structure 866. Cymbal structure 866 includes a piezoelectric layer 868 and a cymbal endcap 869. Cymbal endcap 869 may be or include a metal, for example stainless steel or Hastelloy. Cymbal endcap 869 is coupled to piezoelectric layer 868, and thus cooling element 820 and remaining portions of anchor 860, at its ends. Cymbal endcap 869 is physically separated from piezoelectric layer 868, and thus cooling element 820 and remaining portions of anchor 860 near its center. Piezoelectric layers 864 and 868, as well as cymbal endcap 869 are configured to induce motion in anchor 860. Although described in the context of a piezoelectric, in some embodiments another material can be used. For example, another material that causes anchor 860 to undergo motion (e.g. in response to an electrical signal) may be used. As shown in FIGS. 8B and 8C, piezoelectric layer 864 and cymbal structure 869 may be driven such that either translational motion (shown in FIG. 8B) or bending (shown in FIG. 8C) may be induced in anchor 860. This motion is indicated by the unlabeled, two-headed arrows of FIGS. 8A and 8B. Because at least a portion of anchor 860 undergoes translational or bending motion, the central portion of cooling element 820 also undergoes translational or bending motion. As a result, vibrational motion is induced in cooling element 820.

Figure 8D:
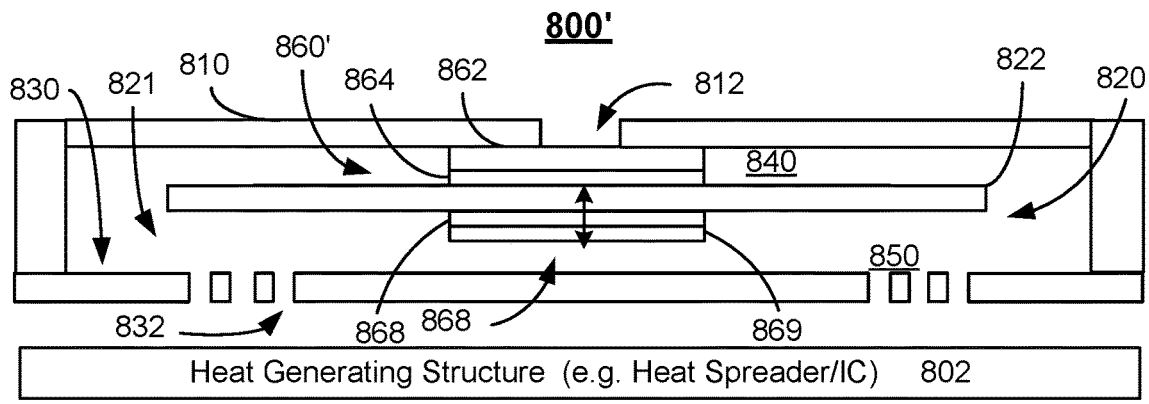

Similarly, FIG. 8D depicts an embodiment of cooling system 800'. For simplicity, only portions of cooling system 800' are shown. Cooling system 800' is analogous to cooling systems 100, 400, 600, and 800. Consequently, analogous components have similar labels. Cooling system 800' includes top plate 810 having vent 812, cooling element 820, orifice plate 830 including orifices 832, top chamber 840 having a gap, bottom chamber 850 having a gap and anchor (i.e. support structure) 860' that are analogous to top plate 110 having vent 112, cooling element 120, orifice plate 130 including orifices 132, top chamber 140 having gap 142, bottom chamber 150 having gap 152 and anchor (i.e. support structure) 160, respectively. Cooling system 800' is used in connection with heat-generating structure 802, which is analogous to heat-generating structure 102. Cooling system 800' is analogous to cooling system 800, but anchor 860' suspends cooling element 820 at its top such that at least a portion of the perimeter of cooling element 820 is free to vibrate. In some embodiments, anchor 860' extends along the axis of cooling element 820 (e.g. in a manner analogous to anchor 260A and/or 260B). In other embodiments, anchor 860 is only near the center portion of cooling element 820 (e.g. analogous to anchor 360A and/or 360B).

Figure 8E:
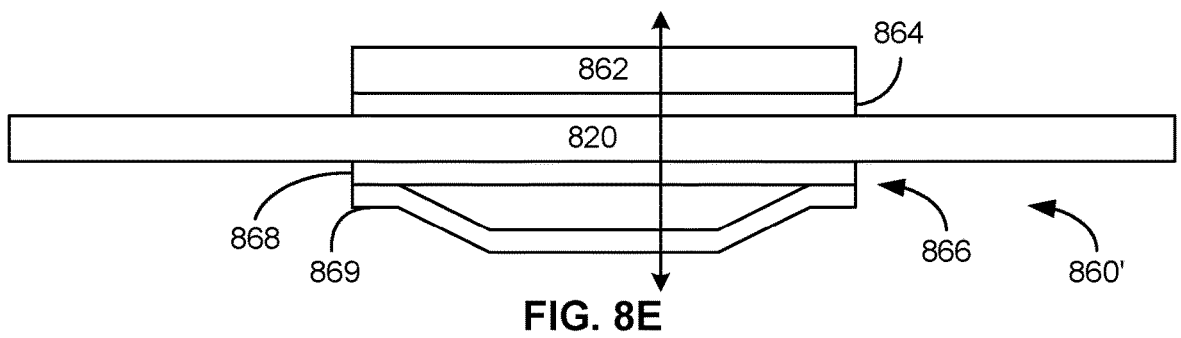
Figure 8F:
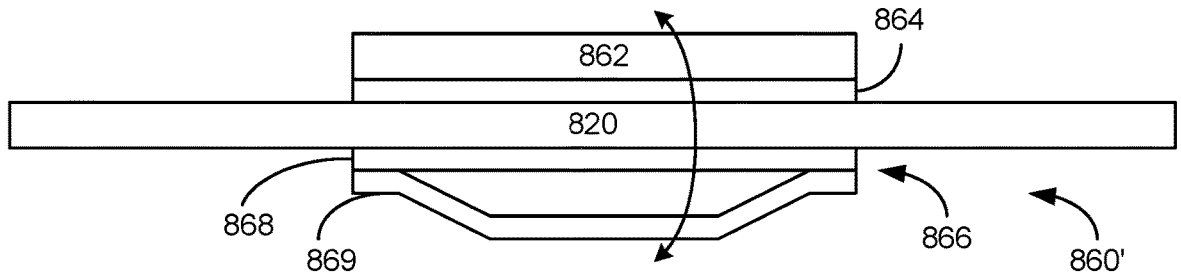

FIGS. 8E and 8F depict views of anchor 860' as well as cooling element 820 perpendicular to that shown in FIG. 8D. Referring to FIGS. 8D-8F, anchor 860' is includes base 862, piezoelectric layer 864 and cymbal structure 866 including piezoelectric layer 868 and cymbal endcap 869. Anchor 860' is analogous to anchor 860, but is utilized to suspend cooling element 820 from top plate 810. Piezoelectric layers 864 and 868, as well as cymbal endcap 869 are configured to induce motion in anchor 860'. Although described in the context of a piezoelectric, in some embodiments another material can be used. For example, another material that causes anchor 860' to undergo motion (e.g. in response to an electrical signal) may be used. As shown in FIGS. 8E and 8F, piezoelectric layer 864 and cymbal structure 869 may be driven such that either translational motion (shown in FIG. 8E) or bending (shown in FIG. 8F) may be induced in anchor 860'. This motion is indicated by the unlabeled, two-headed arrows of FIGS. 8E and 8F. Because at least a portion of anchor 860' undergoes translational or bending motion, the central portion of cooling element 820 also undergoes translational or bending motion. As a result, vibrational motion is induced in cooling element 820.

Figure 8G:
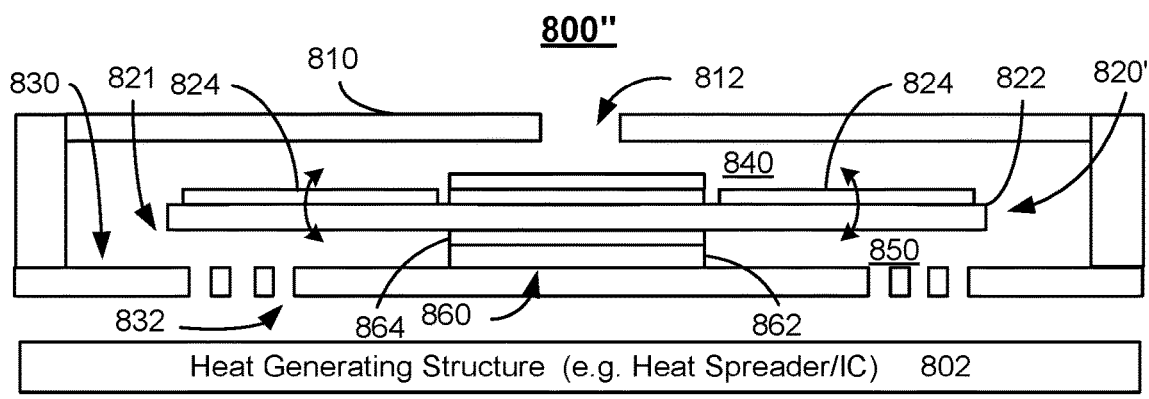

FIG. 8G depicts an embodiment of cooling system 800". For simplicity, only portions of cooling system 800" are shown. Cooling system 800" is analogous to cooling systems 100, 400, 600, 800 and 800'. Consequently, analogous components have similar labels. Cooling system 800" includes top plate 810 having vent 812, cooling element 820', orifice plate 830 including orifices 832, top chamber 840 having a gap, bottom chamber 850 having a gap and anchor (i.e. support structure) 860 that are analogous to top plate 110 having vent 112, cooling element 120, orifice plate 130 including orifices 132, top chamber 140 having gap 142, bottom chamber 150 having gap 152 and anchor (i.e. support structure) 160, respectively. Cooling system 800" is used in connection with heat-generating structure 802, which is analogous to heat-generating structure 102. Cooling system 800' is analogous to cooling systems 800 and 800'. Thus, anchor 860 is shown. In other embodiments, anchor 860' that suspends cooling element 820' from its top might be used.

In the embodiment shown, cooling element 820' also includes piezoelectric layers 824 that may be used to directly drive cooling element 820' in addition to being driven using anchor 860. Although shown as residing on the top of cooling element 820', piezoelectric layer 824 may be embedded in or on the bottom of cooling element 820'. Further, multiple piezoelectric layers might be used in cooling element 820'. Thus, both anchor 860 and cooling element 820' can be driven. Anchor 860 is translated or bent, which induces vibrational motion in cooling element 820'. In addition, cooling element 820' is driven to vibrate by driving piezoelectric layers 824. In other embodiments, anchor 860' may be used in conjunction with a cooling element analogous to cooling element 820'.

Cooling systems 800, 800' and 800" function in an analogous manner to cooling system 100. Consequently, the benefits described with respect to cooling system 100 may be achieved by cooling system(s) 800, 800' and/or 800". Thus, performance of a device incorporating cooling 800, 800' and/or 800" may be improved.

Figure 9A:
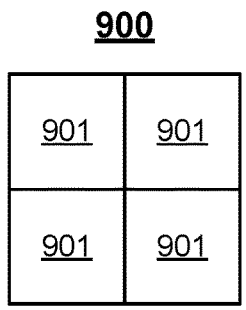
FIGS. 9A-9B depict an embodiment of an active cooling system including multiple cooling cells configured as a tile.
Figure 9B:
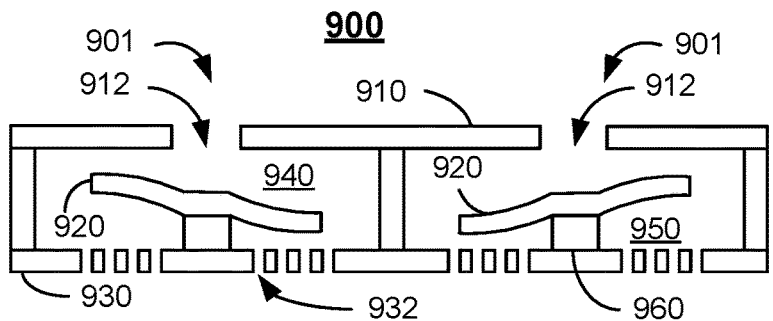

FIGS. 9A-9B depict an embodiment of active cooling system 900 including multiple cooling cells configured as a tile. FIG. 9A depicts a top view, while FIG. 9B depicts a side view. FIGS. 9A-9B are not to scale. Cooling system 900 includes four cooling cells 901, which are analogous to one or more of cooling systems described herein, such as cooling systems 100, 400, 500, 600, 700, 800, 800', and/or 800". Although four cooling cells 901 in a 2×2 configuration are shown, in some embodiments another number and/or another configuration of cooling cells 901 might be employed. In the embodiment shown, cooling cells 901 include shared top plate 910 having apertures 912, cooling elements 920, shared orifice plate 930 including orifices 932, top chambers 940, bottom chambers 950 and anchors (support structures) 960 that are analogous to top plate 110 having apertures 112, cooling element 120, orifice plate 130 having orifices 132, top chamber 140, bottom chamber 150 and anchor 160. Although bottom anchors 960 are shown, in other embodiments top anchors may be used. Thus, anchor(s) 160, 460, 560, 660, 760, 860, and/or 860' may be employed. In the embodiment shown, Cooling elements 920 are driven out-of-phase (i.e. in a manner analogous to a seesaw). Further, cooling element 920 in one cell is driven out-of-phase with cooling element(s) in adjacent cell(s).

Cooling cells 901 of cooling system 900 function in an analogous manner to cooling system(s) 100, 400, 500, 600, 700, 800, 800' and/or 800". Consequently, the benefits described herein may be shared by cooling system 900. Because cooling elements in nearby cells are driven out-of-phase, vibrations in cooling system 900 may be reduced. Because multiple cooling cells 901 are used, cooling system 900 may enjoy enhanced cooling capabilities.

Figure 10:
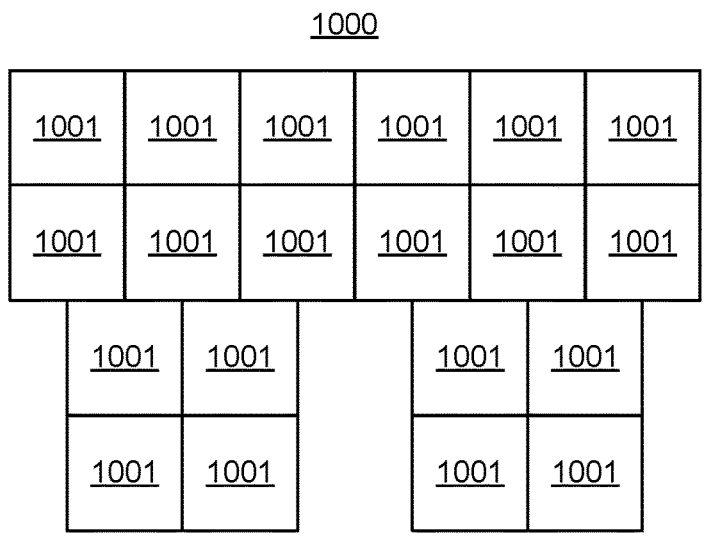
FIG. 10 depicts an embodiment of an active cooling system including multiple cooling cells.

FIG. 10 depicts a top view of an embodiment of cooling system 1000 including multiple cooling cells 1001. FIG. 10 is not to scale. Cooling cells 1001 are analogous one or more of the cooling systems described herein, such as cooling systems 100, 400, 500, 600, 700, 800, 800', 800", and/or 900. As indicated in cooling system 1000, cooling cells 1001 may be arranged in a two-dimensional array of the desired size and configuration. In some embodiments, cooling system 1000 may be viewed as made up of multiple tiles 900. Thus, the desired cooling power and configuration may be achieved.

Figure 11:
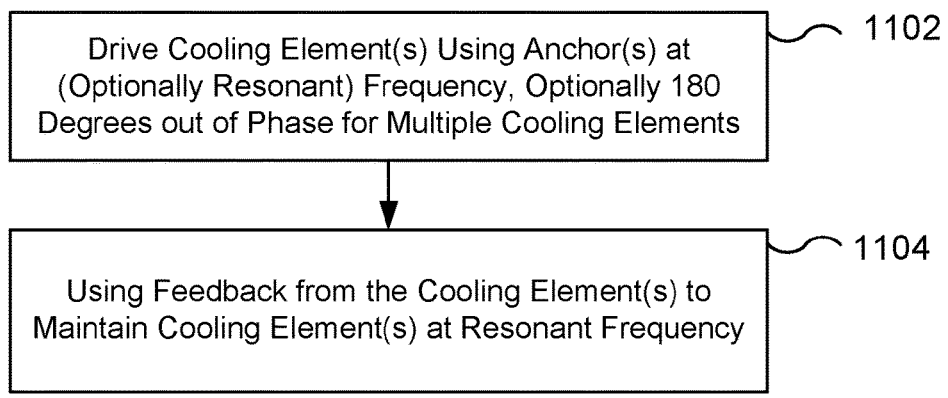
FIG. 11 is a flow chart depicting an embodiment of a technique for driving a cooling element.

FIG. 11 is a flow chart depicting an exemplary embodiment of method 1100 for operating a cooling system. Method 1100 may include steps that are not depicted for simplicity. Method 1100 is described in the context of piezoelectric cooling system 100. However, method 1100 may be used with other cooling systems including but not limited to systems and cells described herein.

One or more of the cooling element(s) in a cooling system is actuated to vibrate, at 1102. At 1102, one or more electrical signals having the desired frequency are used to drive the cooling element(s). For example, electrical signal(s) may be used to cause piezoelectric elements to translate or bend. These piezoelectric elements cause the unpinned portion(s) of the cooling element(s) to vibrate. In some embodiments, the cooling elements are driven at or near structural and/or acoustic resonant frequencies at 1102. The driving frequency may be 15 kHz or higher. If multiple cooling elements are driven at 1102, the cooling elements may be driven out-of-phase. In some embodiments, the cooling elements are driven substantially at one hundred and eighty degrees out of phase. Further, in some embodiments, individual cooling elements are driven out-of-phase. For example, different portions of a cooling element may be driven to vibrate in opposite directions (i.e. analogous to a seesaw). In some embodiments, individual cooling elements may be driven in-phase (i.e. analogous to a butterfly). In addition, the drive signal may be provided to the anchor(s), the cooling element(s), or both the anchor(s) and the cooling element(s). Further, the anchor may be driven to bend and/or translate.

Feedback from the piezoelectric cooling element(s) is used to adjust the driving current, at 1104. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1104 allow the drift in resonant frequency to be accounted for.

For example, piezoelectric cooling element 120 may be driven at its structural resonant frequency/frequencies, at 1102. This resonant frequency may also be at or near the acoustic resonant frequency for top chamber 140. This may be achieved by driving piezoelectric layer(s) in anchor 160 (not shown in FIGS. 1A-1E) and/or piezoelectric layer(s) in cooling element 120. At 1104, feedback is used to maintain cooling element 120 at resonance and, in some embodiments in which multiple cooling elements are driven, one hundred and eighty degrees out of phase. Thus, the efficiency of cooling element 120 in driving fluid flow through cooling system 100 and onto heat-generating structure 102 may be maintained. In some embodiments, 1104 includes sampling the current through cooling element 120 and/or the current through anchor 160 and adjusting the current to maintain resonance and low input power.

Consequently, cooling elements, such as cooling element(s) 120, 420, 520, 620, 720, 820, 820' and/or 920, may operate as described above. Method 1100 thus provides for use of piezoelectric cooling systems described herein. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
a support structure;
a cooling element having a first cantilevered region, a second cantilevered region, a central region between the first cantilevered region and the second cantilevered region, and a perimeter, the cooling element being supported by the support structure at the central region, at least a portion of the perimeter being unpinned, the cooling element being configured to undergo vibrational motion of the first cantilevered region and the second cantilevered region when actuated; and
an orifice plate having at least one orifice therein, the orifice plate being disposed between the cooling element and a heat-generating structure, the cooling element being actuated to drive a fluid through the at least one orifice, the fluid having a speed of at least thirty meters per second after exiting the at least one orifice;
wherein the cooling element has a first side distal from the orifice plate and a second side proximate to the orifice plate, the support structure supporting the cooling element from one of the first side or the second side.

2. The cooling system of claim 1, wherein the support structure supports the cooling element from the first side.

3. The cooling system of claim 1, wherein the support structure induces the vibrational motion in the cooling element.

4. The cooling system of claim 3, wherein the support structure includes a piezoelectric element that translates a central portion of the cooling element, thereby inducing the vibrational motion in the cooling element.

5. The cooling system of claim 3, wherein the support structure includes at least one piezoelectric element that bends a central portion of the cooling element, thereby inducing the vibrational motion in the cooling element.

6. The cooling system of claim 3, further comprising:
a cymbal endcap, the cymbal endcap including edge regions coupled to the support structure and a center portion distal from the support structure.

7. The cooling system of claim 1, wherein the cooling element includes a piezoelectric element distal from the central region, the piezoelectric element inducing the vibrational motion of the cooling element.

8. A cooling system, comprising:
a plurality of cooling cells, each of the plurality of cooling cells including a support structure, and a cooling element having a first cantilevered region, a second cantilevered region, a central region between the first cantilevered region and the second cantilevered region, and a perimeter, the cooling element being supported by the support structure at the central region, at least a portion of the perimeter being unpinned, the cooling element being configured to undergo vibrational motion of the first cantilevered region and the second cantilevered region when actuated to drive a fluid, the cooling element having a first side distal from an orifice plate and a second side proximate to the orifice plate, the support structure supporting the cooling element from one of the first side or the second side; and
the orifice plate having a plurality of orifices therein, a portion of the plurality of orifices corresponding to each of the plurality of cooling cells, the orifice plate being disposed between the cooling element and a heat-generating structure, the cooling element being actuated to drive the fluid through the portion of the plurality of orifices, the fluid having a speed of at least thirty meters per second after exiting the portion of the plurality of orifices.

9. The cooling system of claim 8, wherein the support structure supports the cooling element from the first side.

10. The cooling system of claim 8, wherein the support structure is configured to induce the vibrational motion in the cooling element.

11. The cooling system of claim 10, wherein the support structure includes a piezoelectric element configured to translate a central portion of the cooling element, thereby inducing the vibrational motion in the cooling element.

12. The cooling system of claim 10, wherein the support structure includes a piezoelectric element configured to bend a central portion of the cooling element, thereby inducing the vibrational motion in the cooling element.

13. The cooling system of claim 10, further comprising:
a cymbal endcap, the cymbal endcap including edge regions coupled to the support structure and a center portion distal from the support structure.

14. The cooling system of claim 8, wherein the cooling element includes a piezoelectric element distal from the central region, the piezoelectric element inducing the vibrational motion of the cooling element.

15. A method of cooling a heat-generating structure, comprising:
driving a cooling element to induce a vibrational motion at a frequency, the cooling element having a first cantilevered region, a second cantilevered region, a central region between the first cantilevered region and the second cantilevered region, and a perimeter, the cooling element being supported by a support structure at the central region, at least a portion of the perimeter being unpinned, the cooling element being configured to undergo the vibrational motion of the first cantilevered region and the second cantilevered region when actuated to drive a fluid, the cooling element being actuated to drive the fluid through at least one orifice in an orifice plate between the cooling element and the heat-generating structure, the fluid having a speed of at least thirty meters per second after exiting the at least one orifice, the cooling element having a first side distal from the orifice plate and a second side proximate to the orifice plate, the support structure supporting the cooling element from one of the first side or the second side.

16. The method of claim 15, wherein the support structure supports the cooling element from the first side.

17. The method of claim 15, wherein the support structure is configured to induce the vibrational motion in the cooling element and wherein the driving includes:
utilizing the support structure to at least one of translate and bend a center portion of the cooling element.

18. The method of claim 17, wherein a cymbal endcap including edge regions and a central portion is coupled to the support structure, the edge regions being coupled to the support structure, the central region being distal from the support structure and wherein the utilizing further includes:
using the cymbal endcap to induce the at least one of the translate and the bend.

19. The method of claim 15, wherein the frequency is in proximity to at least one of a structural resonant frequency for the cooling element or a fluidic resonant frequency.

* * * * *